US012726172B2

(12) United States Patent
Takata

(10) Patent No.: US 12,726,172 B2
(45) Date of Patent: Sep. 1, 2026

(54) MULTIPLEXER

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 74 days.

(21) Appl. No.: 18/971,357

(22) Filed: Dec. 6, 2024

(65) Prior Publication Data

US 2025/0096771 A1 Mar. 20, 2025

Related U.S. Application Data

(63) Continuation of application No. PCT/JP2023/021209, filed on Jun. 7, 2023.

(30) Foreign Application Priority Data

Jun. 15, 2022 (JP) ................................ 2022-096698

(51) Int. Cl.
*H03H 9/02* (2006.01)
*H03H 9/25* (2006.01)
(Continued)

(52) U.S. Cl.
CPC .......... *H03H 9/02834* (2013.01); *H03H 9/25* (2013.01); *H03H 9/6483* (2013.01); *H03H 9/725* (2013.01)

(58) Field of Classification Search
CPC ........ H03H 9/725; H03H 9/6483; H03H 9/25; H03H 9/706; H03H 9/72; H03H 9/542;
(Continued)

(56) References Cited

U.S. PATENT DOCUMENTS

2004/0095206 A1 5/2004 Tsutsumi et al.
2009/0096551 A1* 4/2009 Yamagata ............. H03H 9/725 333/193

(Continued)

FOREIGN PATENT DOCUMENTS

JP 2004120685 A 4/2004
JP 2010239612 A 10/2010

(Continued)

OTHER PUBLICATIONS

International Search Report in PCT/JP2023/021209, mailed Aug. 22, 2023, 2 pages.

(Continued)

*Primary Examiner* — John W Poos
(74) *Attorney, Agent, or Firm* — Keating & Bennett, LLP

(57) ABSTRACT

A multiplexer includes a transmission filter and a reception filter each including resonators including one or more series arm resonators. The transmission filter includes a piezoelectric substrate and a first series arm resonator unit on the piezoelectric substrate. The reception filter shares the piezoelectric substrate with the transmission filter and includes a second series arm resonator unit on the piezoelectric substrate. The transmission filter includes an input terminal, an output terminal, and a ground terminal. In a circuit configuration of the transmission filter, a path connecting the input terminal and the output terminal is a series arm, a path branching from the series arm to the ground terminal is a parallel arm, and a connection point between the series arm and the parallel arm is a node.

20 Claims, 5 Drawing Sheets

(51) Int. Cl.
*H03H 9/64* (2006.01)
*H03H 9/72* (2006.01)

(58) Field of Classification Search
CPC .......... H03H 9/64; H03H 9/145; H03H 9/605; H03H 9/6489; H03H 9/568; H03H 9/02992; H03H 9/6403; H03H 9/6436; H03H 9/6433; H03H 9/02559; H03H 9/14541; H03H 9/6479; H03H 9/70; H03H 9/0028; H03H 9/02834; H03H 9/14544; H03H 9/02637; H03H 9/0085; H03H 9/02574; H03H 9/6406; H03H 9/0576; H03H 9/54; H03H 9/205; H03H 9/0009; H03H 9/02228; H03H 9/6476; H03H 9/0071; H03H 9/0222; H03H 9/059; H03H 9/14588; H03H 9/02818; H03H 9/1452; H03H 9/1457; H03H 9/46; H03H 9/0057; H03H 9/008; H03H 9/13; H03H 9/14582; H03H 9/0023; H03H 9/02535; H03H 9/02685; H03H 9/02866; H03H 9/0542; H03H 9/14547; H03H 9/6469; H03H 9/1092; H03H 9/14552; H03H 9/173; H03H 7/1758; H03H 7/38; H03H 9/0038; H03H 9/009; H03H 9/02157; H03H 9/02669; H03H 9/1085; H03H 9/17; H03H 9/44; H03H 9/56; H03H 9/585; H03H 9/6409; H03H 9/6413; H03H 9/6426; H03H 9/644; H03H 9/6496; H03H 2003/0428; H03H 2210/012; H03H 2210/036; H03H 7/0161; H03H 9/0014; H03H 9/02929; H03H 9/02944; H03H 9/0557; H03H 9/0571; H03H 9/14526; H03H 9/547; H03H 9/564; H03H 11/04; H03H 2210/025; H03H 2210/026; H03H 2250/00; H03H 7/0115; H03H 9/0061; H03H 9/02015; H03H 9/02275; H03H 9/02566; H03H 9/02858; H03H 9/02881; H03H 9/02913; H03H 9/02984; H03H 9/058; H03H 9/131; H03H 9/14538; H03H 9/1455; H03H 9/175; H03H 9/58; H03H 9/643; H03H 9/6456; H03H 9/6493; H03H 2003/0435; H03H 7/1766; H03H 7/1775; H03H 9/0042; H03H 9/02007; H03H 9/02118; H03H 9/02952; H03H 9/0547; H03H 9/0566; H03H 9/1064; H03H 9/1071; H03H 9/14502; H03H 9/14517; H03H 9/14594; H03H 9/174; H03H 9/6423; H03H 11/34; H03H 2210/021; H03H 3/04; H03H 3/08; H03H 3/10; H03H 7/075; H03H 7/12; H03H 7/1725; H03H 7/1783; H03H 7/42; H03H 7/46; H03H 7/463; H03H 9/0004; H03H 9/0095; H03H 9/02125; H03H 9/02661; H03H 9/02803; H03H 9/0538; H03H 9/132; H03H 9/133; H03H 9/14561; H03H 9/14591; H03H 9/545; H03H 9/582; H03H 9/588; H03H 9/6453; H03H 9/68; H03H 9/703; H03H 3/02; H03H 7/1708; H03H 7/175; H03H 7/465; H03H 9/0033; H03H 9/02031; H03H 9/02086; H03H 9/02102; H03H 9/02614; H03H 9/02755; H03H 9/02897; H03H 9/14597; H03H 9/176; H03H 9/52; H03H 9/562; H03H 9/6443; H03H 9/6463; H03H 9/66
See application file for complete search history.

(56) References Cited

U.S. PATENT DOCUMENTS

| | | | | |
|---|---|---|---|---|
| 2010/0225418 | A1 | 9/2010 | Kawamoto et al. | |
| 2018/0131349 | A1* | 5/2018 | Takata ................. | H03H 9/6483 |
| 2018/0358951 | A1 | 12/2018 | Ohkubo et al. | |
| 2019/0267970 | A1* | 8/2019 | Nosaka .................... | H03H 9/54 |
| 2020/0295737 | A1* | 9/2020 | Takata ................... | H03H 9/725 |
| 2021/0028764 | A1* | 1/2021 | Takata ................... | H03H 9/205 |
| 2021/0036687 | A1* | 2/2021 | Okude ................... | H03H 9/568 |
| 2021/0099159 | A1* | 4/2021 | Takata ..................... | H03H 9/25 |
| 2022/0123717 | A1 | 4/2022 | Takeuchi | |

FOREIGN PATENT DOCUMENTS

| | | | |
|---|---|---|---|
| JP | 2019004264 | A | 1/2019 |
| KR | 20210011330 | A | 2/2021 |
| KR | 20220011692 | A | 1/2022 |

OTHER PUBLICATIONS

Written Opinion in PCT/JP2023/021209, mailed Aug. 22, 2023, 3 pages.

* cited by examiner

MULTIPLEXER

CROSS REFERENCE TO RELATED APPLICATIONS

This application claims the benefit of priority to Japanese Patent Application No. 2022-096698 filed on Jun. 15, 2022 and is a Continuation Application of PCT Application No. PCT/JP2023/021209 filed on Jun. 7, 2023. The entire contents of each application are hereby incorporated herein by reference.

BACKGROUND OF THE INVENTION

1. Field of the Invention

The present invention relates to multiplexers.

2. Description of the Related Art

To date, multiplexers each having a plurality of acoustic wave resonators have been widely used in filters of mobile phones and the like. Japanese Unexamined Patent Application Publication No. 2019-004264 discloses a plurality of examples of an acoustic wave device that is a duplexer. In the acoustic wave device described in Japanese Unexamined Patent Application Publication No. 2019-004264, both of a transmission filter and a reception filter are provided on the same piezoelectric substrate. The transmission filter and the reception filter each have a plurality of series arm resonators and a plurality of parallel arm resonators. Among the distances between the plurality of resonators of the transmission filter and the plurality of resonators of the reception filter, the distance between the series arm resonators is the shortest.

A series arm resonator generates heat when a duplexer is operating. Therefore, if the distance between series arm resonators is short, heat dissipation capability may be low. If the heat dissipation capability of a series arm resonator is low, the series arm resonator may break easily when a high voltage is applied to the series arm resonator. In this way, the electric power handling capability of the duplexer may deteriorate.

SUMMARY OF THE INVENTION

Example embodiments of the present invention provide multiplexers each with improved heat dissipation capability of a series arm resonator and with electric power handling capability that does not deteriorate easily.

According to an example embodiment of the present invention, a multiplexer includes a transmission filter and a reception filter each including a plurality of resonators including one or more series arm resonators. The transmission filter includes a piezoelectric substrate and a first series arm resonator unit on the piezoelectric substrate. The reception filter shares the piezoelectric substrate with the transmission filter and includes a second series arm resonator unit on the piezoelectric substrate. The transmission filter includes an input terminal, an output terminal, and at least one ground terminal, and, in a circuit configuration of the transmission filter, a path connecting the input terminal and the output terminal is a series arm, a path branching from the series arm to the ground terminal is a parallel arm, and a connection point between the series arm and the parallel arm is a node. The first series arm resonator unit is one of the series arm resonators in the transmission filter or a group of a plurality of the series arm resonators in the transmission filter that are connected in series to each other without the node therebetween. The reception filter includes an input terminal, an output terminal, and at least one ground terminal, and, in a circuit configuration of the reception filter, a path connecting the input terminal and the output terminal is a series arm, a path branching from the series arm to the ground terminal is a parallel arm, and a connection point between the series arm and the parallel arm is a node. The second series arm resonator unit includes one of the series arm resonators in the reception filter or a group of a plurality of the series arm resonators in the reception filter that are connected in series to each other without the node therebetween. On the piezoelectric substrate, among all of the series arm resonators of the transmission filter, one of the series arm resonators in the first series arm resonator unit is located at a shortest distance to all of the resonators of the reception filter. On the piezoelectric substrate, among all of the resonators of the reception filter, one of the series arm resonators in the second series arm resonator unit is located at a shortest distance to one of the series arm resonators of the first series arm resonator unit of the transmission filter. The first series arm resonator unit includes a first series arm resonator with a smallest electrostatic capacitance among all of the series arm resonators of the transmission filter, and the second series arm resonator unit includes a second series arm resonator with a largest electrostatic capacitance among all of the series arm resonators of the reception filter.

According to an example embodiment of the present invention, a multiplexer includes a transmission filter and a reception filter each including a plurality of resonators including one or more series arm resonators. The transmission filter includes a piezoelectric substrate and a first series arm resonator unit on the piezoelectric substrate. The reception filter shares the piezoelectric substrate with the transmission filter and includes a second series arm resonator unit on the piezoelectric substrate. The transmission filter includes an input terminal, an output terminal, and at least ground terminal, and, in a circuit configuration of the transmission filter, a path connecting the input terminal and the output terminal is a series arm, a path branching from the series arm to the ground terminal is a parallel arm, and a connection point between the series arm and the parallel arm is a node. The first series arm resonator unit includes one of the series arm resonators in the transmission filter or a group of a plurality of the series arm resonators in the transmission filter that are connected in series to each other without the node therebetween. The reception filter includes an input terminal, an output terminal, and at least one ground terminal, and, in a circuit configuration of the reception filter, a path connecting the input terminal and the output terminal is a series arm, a path branching from the series arm to the ground terminal is a parallel arm, and a connection point between the series arm and the parallel arm is a node. The second series arm resonator unit includes one of the series arm resonators in the reception filter or a group of a plurality of the series arm resonators in the reception filter that are connected in series to each other without the node therebetween. On the piezoelectric substrate, among all of the series arm resonators of the transmission filter, one of the series arm resonators in the first series arm resonator unit is disposed at a shortest distance to all of the resonators of the reception filter. On the piezoelectric substrate, among all of the resonators of the reception filter, one of the series arm resonators in the second series arm resonator unit is located at a shortest distance to one of the series arm resonators of the first series arm resonator unit of the transmission filter.

The series arm resonators of each of the transmission filter and the reception filter each include an IDT electrode, and each of the IDT electrodes includes a plurality of electrode fingers and includes a crossing region in which, when a direction in which the plurality of electrode fingers extend is defined as an electrode-finger-extending direction, the electrode fingers that are adjacent to each other overlap each other in a direction perpendicular or substantially perpendicular to the electrode-finger-extending direction. When a dimension of the crossing region in the electrode-finger-extending direction is defined as a crossing width, the first series arm resonator unit includes a first series arm resonator for which a product of the number of pairs of the plurality of electrode fingers and the crossing width is smallest among all of the series arm resonators of the transmission filter, and the second series arm resonator unit includes a second series arm resonator for which the product of the number of pairs of the plurality of electrode fingers and the crossing width is largest among all of the series arm resonators of the reception filter.

With the multiplexers according to example embodiments of the present invention, the heat dissipation capability of a series arm resonator is improved and electric power handling capability does not deteriorate easily.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Hereafter, the present invention will be clarified by describing example embodiments of the present invention with reference to the drawings.

Each of the example embodiments described in the present description is an example and some configurations can be replaced or combined between different example embodiments.

Figure 1:
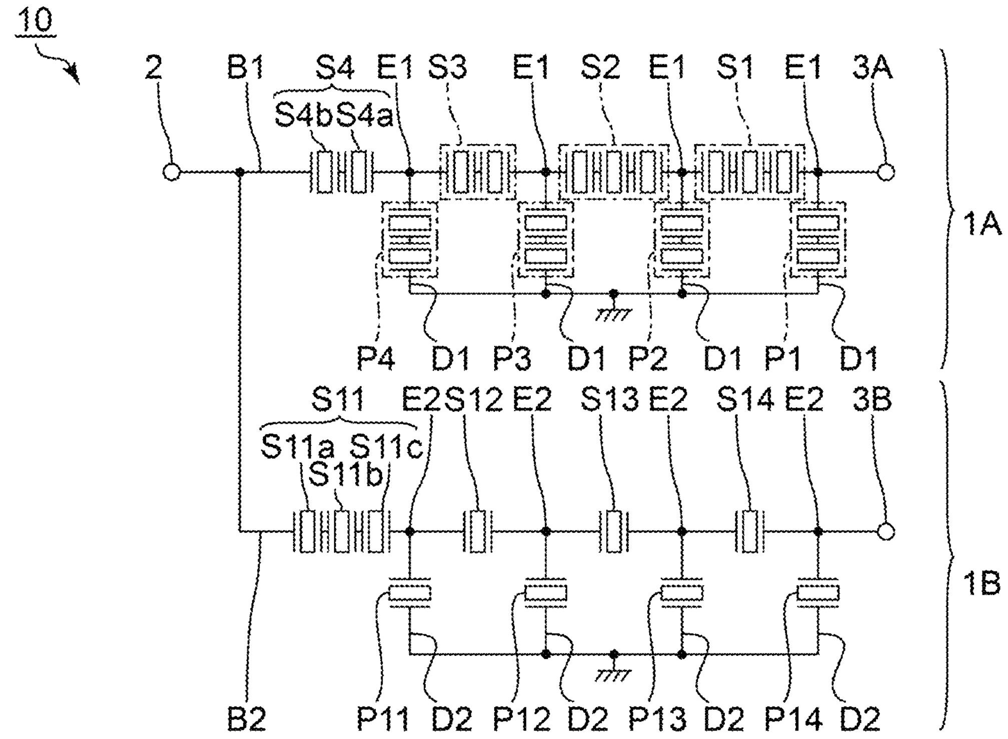
FIG. 1 is a circuit diagram of a multiplexer according to an example embodiment of the present invention.

FIG. 1 is a circuit diagram of a multiplexer according to an example embodiment of the present invention.

As illustrated in FIG. 1, a multiplexer 10 according to the present example embodiment is, for example, a duplexer. The multiplexer 10 includes a transmission filter 1A and a reception filter 1B. However, the multiplexer 10 is not limited to a duplexer. The multiplexer 10 may include at least one filter other than the transmission filter 1A and the reception filter 1B. The multiplexer 10 may be a multiplexer including three or more filters, such as a triplexer or a quadplexer, The communication band of the multiplexer 10 is, for example, Band 3. The pass band of the transmission filter 1A is the transmission band of Band 3, which is, for example, 1710 MHz to 1785 MHz. The pass band of the reception filter 1B is the reception band of Band 3, which is, for example, 1805 MHz to 1880 MHz. However, the communication band of the multiplexer 10 is not limited to the above.

The multiplexer 10 includes a common connection terminal 2. The transmission filter 1A and the reception filter 1B are connected in common to the common connection terminal 2. That is, the transmission filter 1A and the reception filter 1B share the common connection terminal 2. The common connection terminal 2 is an output terminal of the transmission filter 1A and is an input terminal of the reception filter 1B. Further, in the present example embodiment, the common connection terminal 2 is, for example, an antenna terminal. The antenna terminal is connected to an antenna.

The transmission filter 1A includes a first signal terminal 3A, a plurality of ground terminals, and a plurality of resonators. The first signal terminal 3A is an input terminal of the transmission filter 1A. The ground terminals are terminals connected to a reference potential. The plurality of resonators are a plurality of series arm resonators and a plurality of parallel arm resonators. The transmission filter 1A is, for example, a ladder filter.

In the circuit configuration of the transmission filter 1A, a series arm B1, a plurality of parallel arms D1, and a plurality of nodes E1 are provided. To be more specific, in the circuit configuration of the transmission filter 1A, for example, four parallel arms D1 and four nodes E1 are provided. The series arm B1 is a path that connects the first signal terminal 3A as an input terminal and the common connection terminal 2 as an output terminal. Each series arm resonator is provided in the series arm B1. On the one hand, each parallel arm D1 is a path that branches from the series arm B1 to a corresponding ground terminal. Each parallel arm resonator is provided in a corresponding parallel arm D1. On the other hand, the nodes E1 are connection points between the series arm B1 and the parallel arms D1.

In the present example embodiment, the plurality of series arm resonators and the plurality of parallel arm resonators of the transmission filter 1A are all acoustic wave resonators. Each acoustic wave resonator includes an IDT (Interdigital Transducer) electrode.

The transmission filter 1A includes a plurality of series arm resonator units. Each series arm resonator unit includes one series arm resonator or a group of a plurality of series arm resonators that are connected in series to each other without a node E1 therebetween. To be more specific, each series arm resonator unit is a unit that is between the input terminal and a node E1, between nodes E1, or between a node E1 and the output terminal and in which one or more series arm resonators are provided. As described above, in the transmission filter 1A, the input terminal is the first signal terminal 3A. The output terminal is the common connection terminal 2. Each series arm resonator unit may be, for example, a unit including a plurality of divided series arm resonators.

The plurality of series arm resonator units of the transmission filter 1A are, specifically, a series arm resonator unit S1, a series arm resonator unit S2, a series arm resonator unit S3, and a series arm resonator unit S4. In the present example embodiment, each series arm resonator unit includes a plurality of series arm resonators that are divided in series. That is, in all series arm resonator units, a plurality of divided series arm resonators are connected in series to each other.

The plurality of series arm resonator units are connected in series to each other between the first signal terminal 3A and the common connection terminal 2. To be more specific, the series arm resonator unit S1, the series arm resonator unit S2, the series arm resonator unit S3, and the series arm resonator unit S4 are connected in this order from the first signal terminal 3A side.

The series arm resonator unit S4 is a first series arm resonator unit. The first series arm resonator unit includes a first series arm resonator. To be more specific, the series arm resonator unit S4 includes a divided series arm resonator S4*a* and a divided series arm resonator S4*b*. The series arm resonator S4*b* is the first series arm resonator. The electrostatic capacitance of the first series arm resonator is the smallest among the electrostatic capacities of all series arm resonators of the transmission filter 1A.

The series arm resonator unit S1 and the series arm resonator unit S2 each include three divided series arm resonators. The series arm resonator unit S3 includes two divided series arm resonators.

The transmission filter 1A includes a plurality of parallel arm resonator units. Each parallel arm resonator unit includes one parallel arm resonator or a group of a plurality of parallel arm resonators that are connected in series to each other in a parallel arm D1. Each parallel arm resonator unit may be, for example, a unit including a plurality of divided parallel arm resonators. Hereafter, a series arm resonator unit and a parallel arm resonator unit may be collectively and simply referred to as a resonator unit.

The plurality of parallel arm resonator units of the transmission filter 1A are, specifically, a parallel arm resonator unit P1, a parallel arm resonator unit P2, a parallel arm resonator unit P3, and a parallel arm resonator unit P4. In the present example embodiment, all parallel arm resonator units of the transmission filter 1A each include a plurality of parallel arm resonators that are divided series. That is, in all parallel arm resonator unit, a plurality of divided parallel arm resonators are connected in series to each other. To be more specific, all parallel arm resonator units each include two divided parallel arm resonators.

The parallel arm resonator unit P1 is connected between the ground potential and the first signal terminal 3A. The parallel arm resonator unit P2 is connected between the ground potential and a node E1 between the series arm resonator unit S1 and the series arm resonator unit S2. The parallel arm resonator unit P3 is connected between the ground potential and a node E1 between the series arm resonator unit S2 and the series arm resonator unit S3. The parallel arm resonator unit P4 is connected between the ground potential and a node E1 between the series arm resonator unit S3 and the series arm resonator unit S4.

The reception filter 1B includes a second signal terminal 3B, a plurality of ground terminals, and a plurality of resonators. The second signal terminal 3B is an output terminal of the reception filter 1B. On the one hand, as described above, the common connection terminal 2 is an input terminal of the reception filter 1B. The plurality of resonators are a plurality of series arm resonators and a plurality of parallel arm resonators. The reception filter 1B is a ladder filter. As with the transmission filter 1A, in the circuit configuration of the reception filter 1B, a series arm B2, a plurality of parallel arms D2, and a plurality of nodes E2 are provided.

The series arm B2 is a path that connects the common connection terminal 2 as an input terminal and the second signal terminal 3B as an output terminal. Each series arm resonator is provided in the series arm B2. On the one hand, each parallel arm D2 is a path that branches from the series arm B2 to a corresponding ground terminal. Each parallel arm resonator is provided in a corresponding parallel arm D2. On the other hand, the nodes E2 are connection points between the series arm B2 and the parallel arms D2. In the circuit configuration of the reception filter 1B, four parallel arms D2 and four nodes E2 are provided. In the present example embodiment, the plurality of series arm resonators and the plurality of parallel arm resonators of the reception filter 1B are all acoustic wave resonators. In the present description, the definitions of a series arm resonator unit and a parallel arm resonator unit are the same irrespective of the type of the filter. To be specific, in the reception filter 1B, each series arm resonator unit includes one series arm resonator or a group of a plurality of series arm resonators that are connected in series to each other without a node E2 therebetween. To be more specific, each series arm resonator unit is a unit that is between the input terminal and a node E2, between nodes E2, or between a node E2 and the output terminal and in which one or more series arm resonators are provided. Each series arm resonator unit may be, for example, a unit including a plurality of divided series arm resonators.

The reception filter 1B includes a plurality of series arm resonator units. The plurality of series arm resonator units of the reception filter 1B are, specifically, a series arm resonator unit S11, a series arm resonator unit S12, a series arm resonator unit S13, and a series arm resonator unit S14. The plurality of series arm resonator units of the reception filter 1B are connected in series to each other between the common connection terminal 2 and the second signal terminal 3B. To be more specific, the series arm resonator unit S11, the series arm resonator unit S12, the series arm resonator unit S13, and the series arm resonator unit S14 are connected in this order from the common connection terminal 2 side.

The series arm resonator unit S11 is a second series arm resonator unit. The second series arm resonator unit includes a second series arm resonator. To be more specific, the series arm resonator unit S11 includes a divided series arm resonator S11*a*, a divided series arm resonator S11*b*, and a divided series arm resonator S11*c*. The series arm resonator S11*a* is the second series arm resonator. The electrostatic capacitance of the second series arm resonator is the largest among the electrostatic capacities of all series arm resonators of the reception filter 1B.

The series arm resonator unit S12, the series arm resonator unit S13, and the series arm resonator unit S14 each include one series arm resonator.

The reception filter 1B includes a plurality of parallel arm resonator units. The plurality of parallel arm resonator units of the reception filter 1B are, specifically, a parallel arm resonator unit P11, a parallel arm resonator unit P12, a parallel arm resonator unit P13, and a parallel arm resonator unit P14. In the present example embodiment, each parallel arm resonator unit of the reception filter 1B includes one parallel arm resonator.

The parallel arm resonator unit P11 is connected between the ground potential and a node E2 between the series arm resonator unit S11 and the series arm resonator unit S12. The parallel arm resonator unit P12 is connected between the ground potential and a node E2 between the series arm resonator unit S12 and the series arm resonator unit S13. The parallel arm resonator unit P13 is connected between the ground potential and a node E2 between the series arm resonator unit S13 and the series arm resonator unit S14. The parallel arm resonator unit P14 is connected between the ground potential and the second signal terminal 3B.

In the present example embodiment, the resonant frequency of the parallel arm resonator in the parallel arm resonator unit P11 is, for example, about 1783 MHz. The resonant frequency of the parallel arm resonator in the parallel arm resonator unit P12 is, for example, about 1781 MHz. The resonant frequency of the parallel arm resonator in the parallel arm resonator unit P13 is, for example, about 1778 MHz. The resonant frequency of the parallel arm resonator in the parallel arm resonator unit P14 is, for example, about 1774 MHz. The resonant frequency of the parallel arm resonator in the parallel arm resonator unit P11, among the plurality of parallel arm resonator units, is the highest.

The circuit configurations of the transmission filter 1A and the reception filter 1B are not limited to those described above. It is sufficient that the transmission filter 1A includes a plurality of resonators including a first series arm resonator. It is sufficient that the reception filter 1B include a plurality of resonators including a second series arm resonator. Further, when the transmission filter 1A and the reception filter 1B are, for example, ladder filters, it is sufficient that the transmission filter 1A and the reception filter 1B each include at least one ground terminal and include at least one parallel arm resonator. Alternatively, for example, the transmission filter 1A or the reception filter 1B may include a longitudinally-coupled resonator acoustic wave filter as a resonator.

Figure 2:
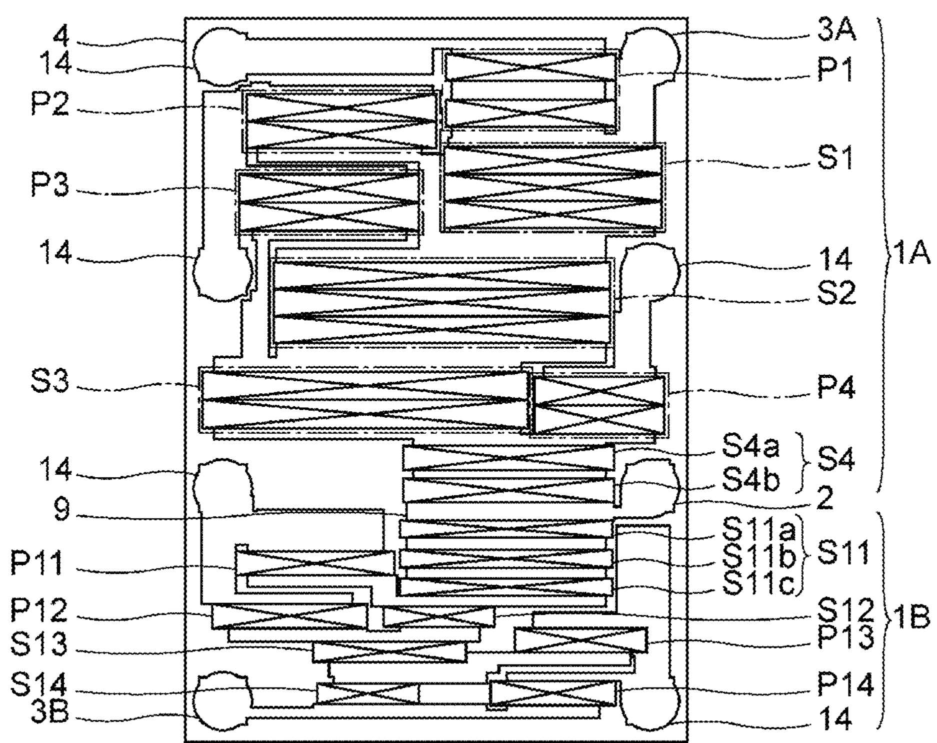
FIG. 2 is a schematic plan view of a multiplexer according to an example embodiment of the present invention.

FIG. 2 is a schematic plan view of a multiplexer according to the first example embodiment. In FIG. 2, resonators are each schematically illustrated as a rectangle with two diagonal lines.

A plurality of acoustic wave resonators are provided on a piezoelectric substrate 4. On the piezoelectric substrate 4, the distance between the series arm resonator S4*b*, which is the first series arm resonator, and the series arm resonator S11*a*, which is the second series arm resonator, is the shortest among the distances between all resonators of the transmission filter 1A and all resonators of the reception filter 1B. However, it is sufficient that the distance between one of the series arm resonators of the series arm resonator unit S4 and one of the series arm resonators of the series arm resonator unit S11 is short. The distance between one of the parallel arm resonators of the transmission filter 1A and one of the series arm resonators of the second series arm resonator unit may be the shortest among the distances between all resonators of the transmission filter 1A and all resonators of the reception filter 1B.

As will be described below in detail, each resonator in the present example embodiment includes a crossing region A illustrated in FIG. 10. In the present description, "the distance between resonators" refers to the shortest distance between the crossing regions A of the resonators.

Referring back to FIG. 2, a plurality of ground terminals 14 are provided on the piezoelectric substrate 4. The transmission filter 1A and the reception filter 1B each include a plurality of ground terminals 14. Each ground terminal 14 is connected to the reference potential. Each ground terminal 14 may be connected to the reference potential with an inductor therebetween.

The present example embodiment may include the following configurations. 1) On the piezoelectric substrate 4, among all of the series arm resonators of the transmission filter 1A, one of the series arm resonators in the first series arm resonator unit is located at the shortest distance to all of the resonators of the reception filter 1B. 2) On the piezoelectric substrate 4, among all of the resonators of the reception filter 1B, one of the series arm resonators in the second series arm resonator unit is located at the shortest distance to one of the series arm resonators of the first series arm resonator unit of the transmission filter 1A. 3) The series arm resonator unit S4 as the first series arm resonator unit includes the series arm resonator S4*b* as the first series arm resonator having the smallest electrostatic capacitance among all of the series arm resonators of the transmission filter 1A. 4) The series arm resonator unit S11 as the second series arm resonator unit includes the series arm resonator S11*a* as the second series arm resonator having the largest electrostatic capacitance among all of the series arm resonators of the reception filter 1B. Thus, it is possible to increase the heat dissipation capability of the series arm resonator, and the electric power handling capability of the multiplexer 10 does not deteriorate easily. Hereafter, this will be described. First, referring to FIGS. 3 and 4, the fact that electric power handling capability decreases due to increase in the temperature of a resonator will be described.

Figure 3:
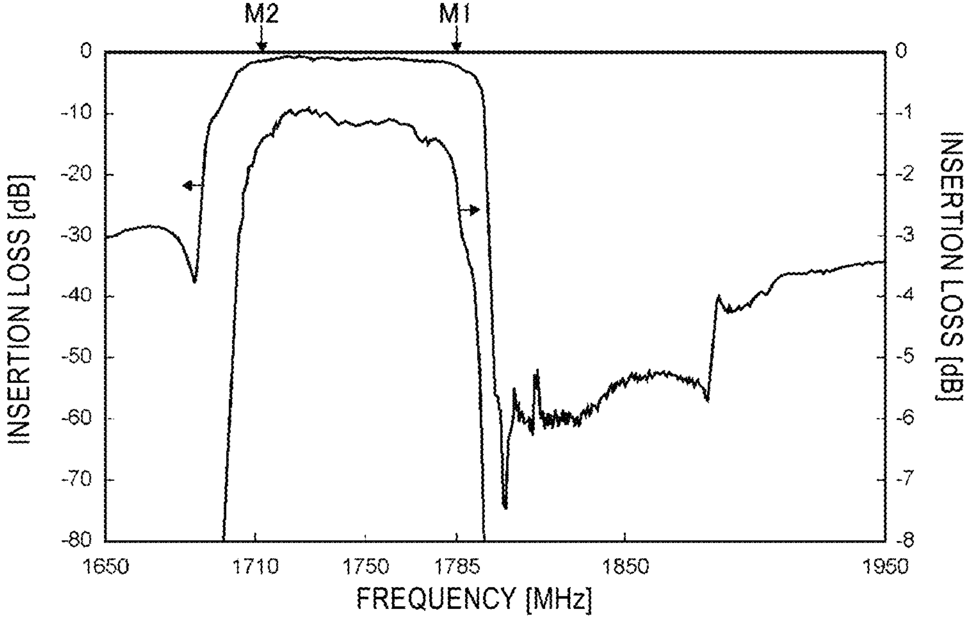
FIG. 3 illustrates attenuation frequency characteristics of a transmission filter in an example embodiment of the present invention.
Figure 4:
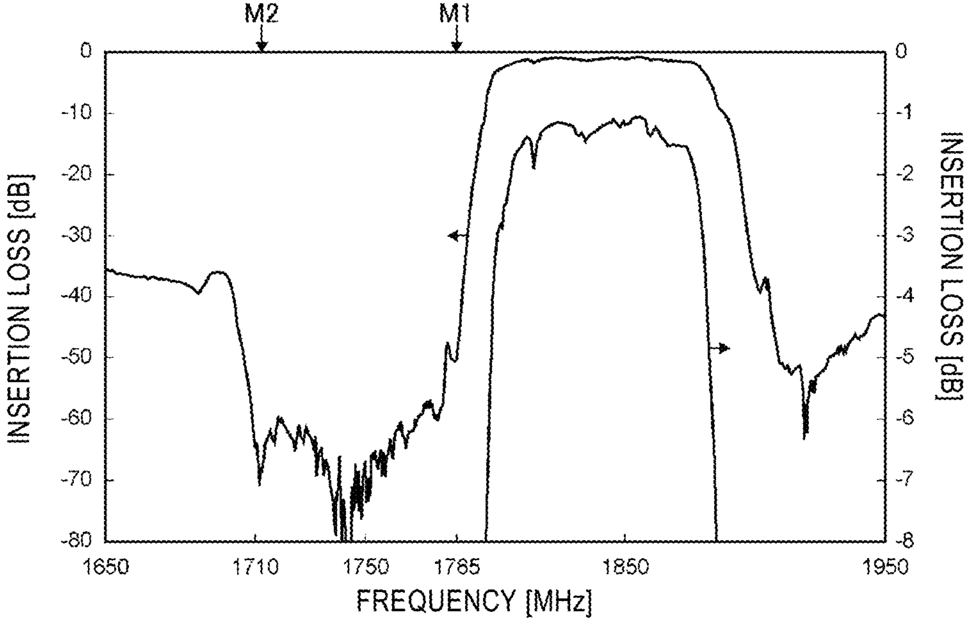
FIG. 4 illustrates attenuation frequency characteristics of a reception filter in an example embodiment of the present invention.

FIG. 3 illustrates the attenuation frequency characteristics of the transmission filter in the first example embodiment. FIG. 4 illustrates the attenuation frequency characteristics of the reception filter in the first example embodiment.

The arrow M1 in FIGS. 3 and 4 indicates the frequency of an end portion on the higher-frequency side in the pass band of the transmission filter 1A. The frequency indicated by the arrow M1 will be denoted by Hch. Hch is, for example, about 1785 MHz. On the other hand, the arrow M2 indicates the frequency of an end portion on the lower-frequency side in the pass band of the transmission filter 1A. The frequency indicated by the arrow M2 will be denoted by Lch. Lch is, for example, about 1710 MHz.

In the first example embodiment, all resonators are acoustic wave resonators. To be more specific, all resonators are surface acoustic wave resonators. In this case, each resonator has a negative temperature coefficient of frequency. Therefore, as the temperature of each resonator increases, the resonant frequency of each resonator decreases. Thus, as the temperature of each resonator increases, a band in which the insertion loss of the transmission filter 1A is small shifts toward the lower-frequency side. Even in this state, Lch indicated by the arrow M2 is positioned in a band in which the insertion loss is small. On the other hand, Hch indicated by the arrow M1 is positioned in a band in which the insertion loss is large. Therefore, electric power applied with Hch is converted into heat easily. If the temperature of an electrode in a resonator becomes too high, the resonator breaks. In this way, due to increase in the temperature of a resonator, it becomes easier for the resonator to generate heat, and the electric power handling capability decreases.

Moreover, Hch is positioned between the resonant frequency and the anti-resonant frequency of the series arm resonator. An acoustic wave resonator generates heat easily when electric power having a frequency between the resonant frequency and the anti-resonant frequency is input. Therefore, the electric power handling capability of the series arm resonator tends to decrease as temperature increases. In contrast, with the first example embodiment, it is possible to improve the heat dissipation capability of a series arm resonator and it is possible to reduce or prevent deterioration of electric power handling capability. Hereafter, details of this advantageous effect will be described by comparing the first example embodiment with first to third comparative examples.

In the first to third comparative examples, the arrangement of a plurality of series arm resonator units and a plurality of parallel arm resonator units on the circuit is the same or substantially the same as that in the first example embodiment. Thus, in the first to third comparative examples, a plurality of series arm resonator units and a plurality of parallel arm resonator units will be denoted by the same reference characters as those in the first example embodiment.

However, the first to third comparative examples differ from the first example embodiment in the number of divided series arm resonators, the total electrostatic capacitance of series arm resonator units or parallel arm resonator units, and the electrode configuration on the piezoelectric substrate.

TABLE 1

| | S1 | S2 | S3 | S4 |
|---|---|---|---|---|
| First Example Embodiment | 3 pF | 4.9 pF | 5.2 pF | 2.5 pF |
| First Comparative Example | 3 pF | 3.3 pF | 5.2 pF | 3.8 pF |
| Second Comparative Example | 3 pF | 4.9 pF | 5.2 pF | 2.5 pF |
| Third Comparative Example | 3 pF | 4.9 pF | 5.2 pF | 2.5 pF |

Table 1 shows the total electrostatic capacitance of each series arm resonator unit of the transmission filter. In Table 1, the results for the first series arm resonator unit are surrounded by thick lines. In the first example embodiment, the second comparative example, and the third comparative example, the first series arm resonator unit is the series arm resonator unit S4. On the other hand, in the first comparative example, the first series arm resonator unit is the series arm resonator unit S1.

TABLE 2

| | S11 | S12 | S13 | S14 |
|---|---|---|---|---|
| First Example Embodiment | 2 pF | 1 pF | 1.5 pF | 1.7 pF |
| First Comparative Example | 2 pF | 1 pF | 1.5 pF | 1.7 pF |
| Second Comparative Example | 1.3 pF | 1 pF | 1.5 pF | 1.7 pF |
| Third Comparative Example | 2 pF | 1 pF | 1.5 pF | 1.7 pF |

Table 2 shows the total electrostatic capacitance of each series arm resonator unit of the reception filter. In Table 2, the results for the second series arm resonator unit are surrounded by thick lines. In the first example embodiment, the first comparative example, and the third comparative example, the second series arm resonator unit is the series arm resonator unit S11. On the other hand, in the second comparative example, the second series arm resonator unit is the series arm resonator unit S14.

TABLE 3

| | S4a | S4b | S11a | S11b | S11c |
|---|---|---|---|---|---|
| First Example Embodiment | 2.74 pF | 2.3 pF | 2.4 pF | 1.9 pF | 1.8 pF |

Table 3 shows the electrostatic capacitance of each series arm resonator in the first series arm resonator unit and the second series arm resonator unit of the first example embodiment. In Table 3, the results for the first series arm resonator and the second series arm resonator are surrounded by thick lines. The electrostatic capacitance of the series arm resonator S4*b*, which is the first series arm resonator, is the smallest among the electrostatic capacities of all series arm resonators of the transmission filter 1A. The electrostatic capacitance of the series arm resonator S11*a*, which is the second series arm resonator, is the largest among the electrostatic capacities of all series arm resonators of the reception filter 1B.

Figure 5:
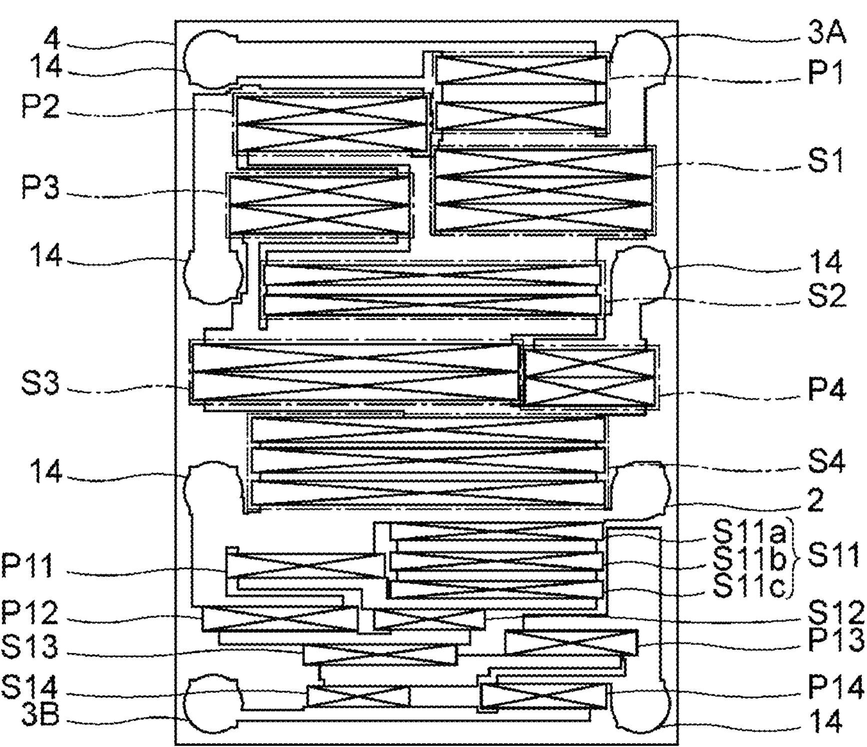
FIG. 5 is a schematic plan view of a multiplexer according to a first comparative example.
Figure 6:
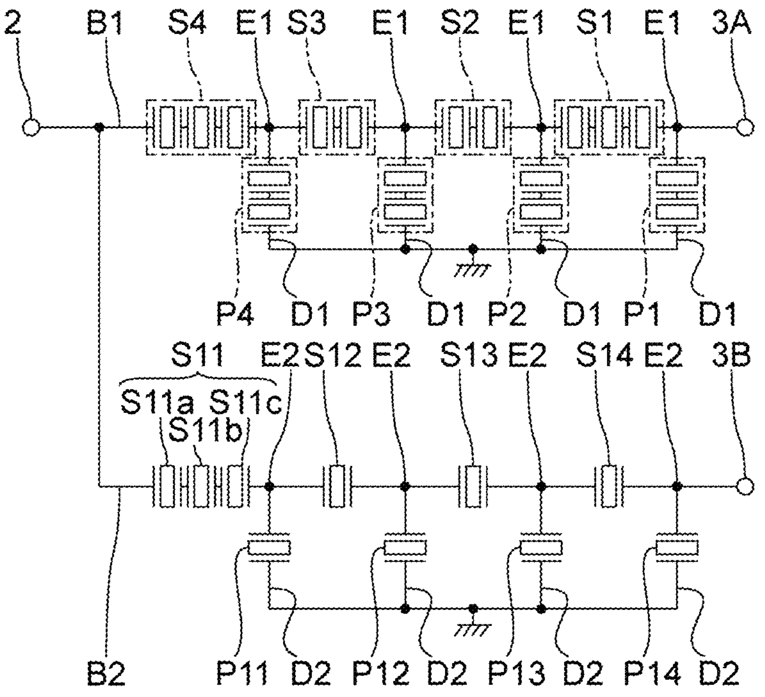
FIG. 6 is a circuit diagram of the multiplexer according to the first comparative example.
Figure 7:
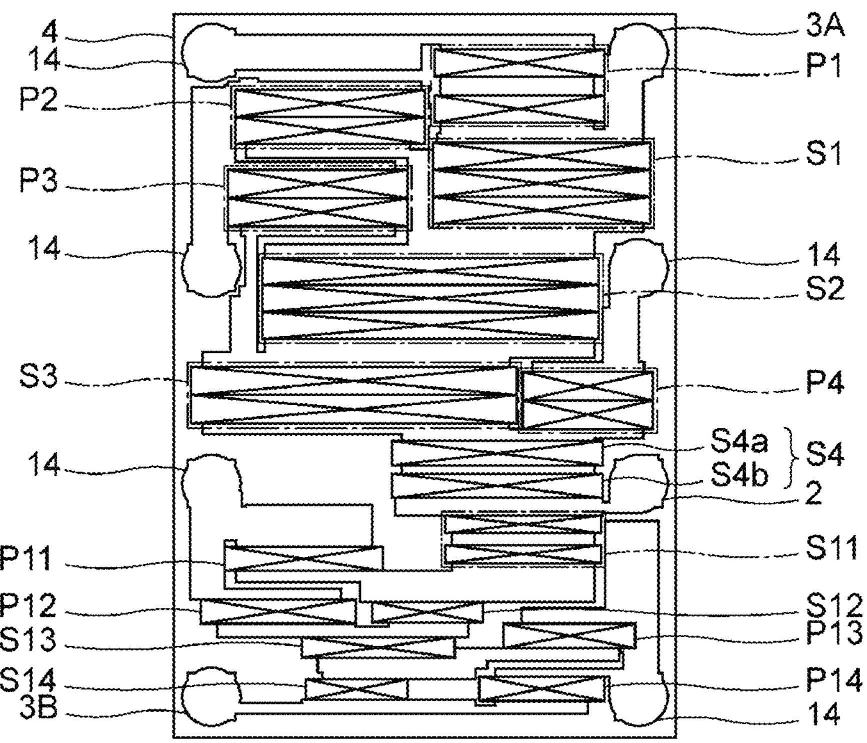
FIG. 7 is a schematic plan view of a multiplexer according to a second comparative example.
Figure 8:
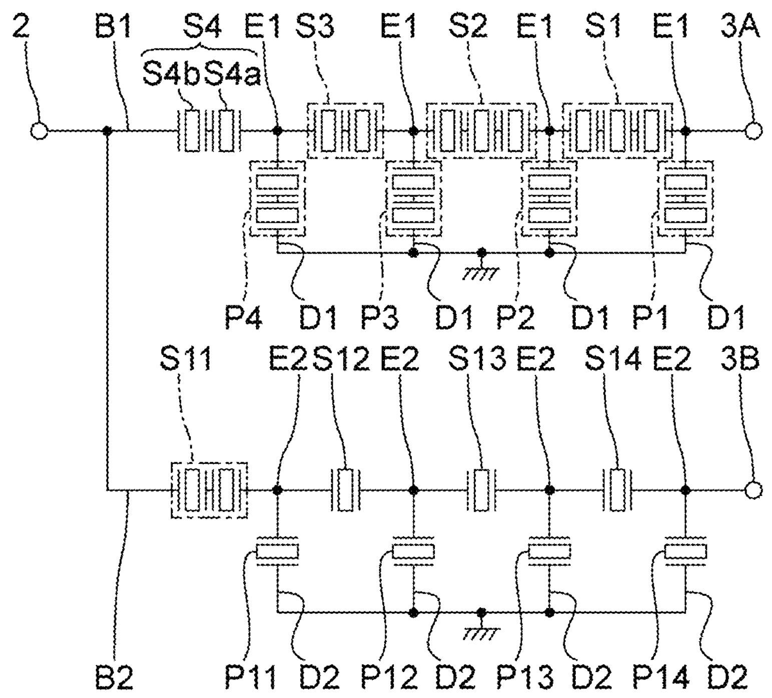
FIG. 8 is a circuit diagram of the multiplexer according to the second comparative example.
Figure 9:
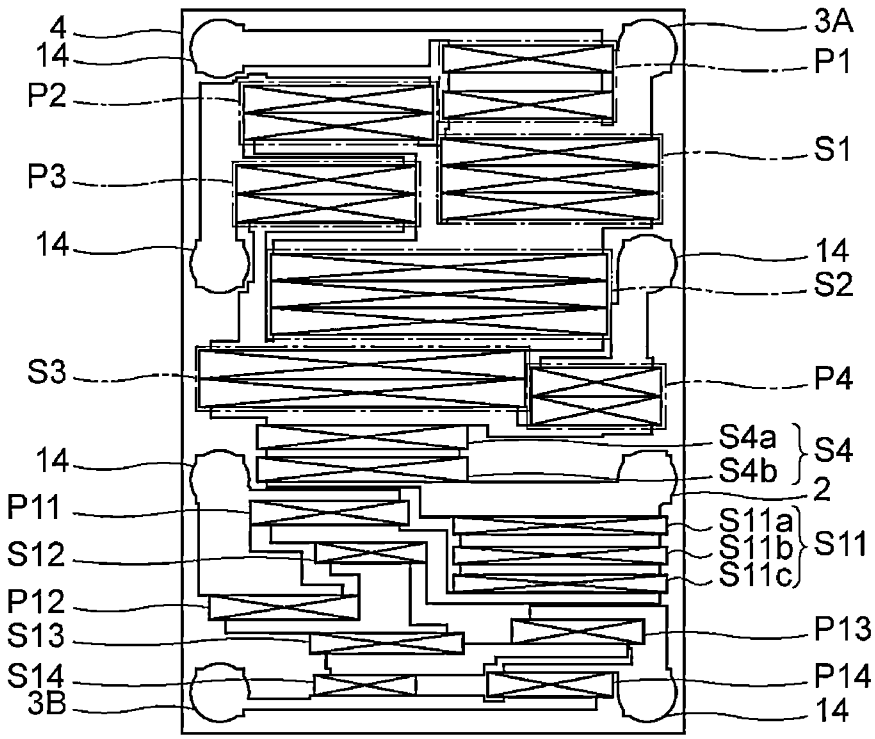
FIG. 9 is a schematic plan view of a multiplexer according to a third comparative example.

FIG. 5 is a schematic plan view of a multiplexer according to the first comparative example. FIG. 6 is a circuit diagram of the multiplexer according to the first comparative example. FIG. 7 is a schematic plan view of a multiplexer according to the second comparative example. FIG. 8 is a circuit diagram of the multiplexer according to the second comparative example. FIG. 9 is a schematic plan view of a multiplexer according to the third comparative example. In the first to third comparative examples, as with the first example embodiment, four parallel arms and four nodes are provided in each of the circuit configurations of the transmission filter and the reception filter.

The first comparative example differs from the first example embodiment in the following respects. As illustrated in FIG. 5, in the first comparative example, the series arm resonator of the series arm resonator unit S4 is located at a shorter distance to the resonator of the reception filter than the series arm resonator unit S1, which is the first series arm resonator unit, is. As illustrated in FIG. 6, in the first comparative example, the number of divided series arm resonators in the series arm resonator unit S2 of the transmission filter is two. The number of divided series arm resonator in the series arm resonator unit S4 is, for example, three.

The second comparative example differs from the first example embodiment in the following respects. As illustrated in FIG. 7, in the second comparative example, the series arm resonator of the series arm resonator unit S11 is located at a shorter distance to the series arm resonator of the series arm resonator unit S4, which is the first series arm resonator unit, than the series arm resonator unit S14, which is the second series arm resonator unit, is. As illustrated in FIG. 8, in the second comparative example, the number of divided series arm resonators in the series arm resonator unit S11 is, for example, two.

The third comparative example differs from the first example embodiment in the following respect. As illustrated in FIG. 9, in the third comparative example, the parallel arm resonator in the parallel arm resonator unit P11 is located at a shorter distance to the series arm resonator of the series arm resonator unit S4, which is the first series arm resonator unit, than the series arm resonator of the series arm resonator unit S11, which is the second series arm resonator unit, is.

The temperatures of each series arm resonator unit and each parallel arm resonator unit in the first example embodiment and the first to third comparative examples were compared. To be specific, electric power of about 31.5 dBm was input to the first signal terminal, and the maximum values of the temperatures of each series arm resonator unit and each parallel arm resonator unit under a condition of an ambient temperature at about 130° C. were compared. Table 4 shows the maximum value of the temperature of each series arm resonator unit in the transmission filter. Table 5 shows the maximum value of the temperature of each parallel arm resonator unit in the transmission filter. Table 6 shows the maximum value of the temperature of each series arm resonator unit in the reception filter. Table 7 shows the maximum value of the temperature of each parallel arm resonator unit in the reception filter. In Table 4, the results for the first series arm resonator unit are surrounded by thick lines. In Table 6, the results for the second series arm resonator unit are surrounded by thick lines.

TABLE 4

| | S1 | S2 | S3 | S4 | Max |
|---|---|---|---|---|---|
| First Example Embodiment | 179° C. | 179° C. | 178° C. | 177° C. | 179° C. |
| First Comparative Example | 182° C. | 184° C. | 181° C. | 175° C. | 184° C. |
| Second Comparative Example | 180° C. | 182° C. | 180° C. | 179° C. | 182° C. |
| Third Comparative Example | 179° C. | 182° C. | 179° C. | 178° C. | 182° C. |

TABLE 5

| | P1 | P2 | P3 | P4 |
|---|---|---|---|---|
| First Example Embodiment | 175° C. | 177° C. | 177° C. | 174° C. |
| First Comparative Example | 177° C. | 179° C. | 180° C. | 169° C. |
| Second Comparative Example | 176° C. | 178° C. | 178° C. | 176° C. |
| Third Comparative Example | 175° C. | 177° C. | 178° C. | 175° C. |

TABLE 6

| | S11 | S12 | S13 | S14 |
|---|---|---|---|---|
| First Example Embodiment | 170° C. | 165° C. | 163° C. | 162° C. |
| First Comparative Example | 169° C. | 164° C. | 163° C. | 162° C. |
| Second Comparative Example | 173° C. | 166° C. | 162° C. | 162° C. |
| Third Comparative Example | 170° C. | 167° C. | 164° C. | 162° C. |

TABLE 7

| | P11 | P12 | P13 | P14 |
|---|---|---|---|---|
| First Example Embodiment | 168° C. | 167° C. | 164° C. | 163° C. |
| First Comparative Example | 167° C. | 167° C. | 164° C. | 163° C. |
| Second Comparative Example | 170° C. | 167° C. | 162° C. | 162° C. |
| Third Comparative Example | 175° C. | 168° C. | 163° C. | 162° C. |

As shown in Table 4, the maximum value of the temperature of each series arm resonator unit in the transmission filter of the first example embodiment is generally small. It can be seen that, in the first example embodiment, the maximum value of the temperature of the entirety of the plurality of series arm resonator units is smaller than those in the first to third comparative examples. The reason for this is as follows. In the first example embodiment, among the plurality of resonators of the transmission filter, the series arm resonator of the first series arm resonator unit is disposed at the shortest distance to the series arm resonator of the second series arm resonator unit. Thus, it is possible to increase the heat dissipation capability of the series arm resonator of the transmission filter. Therefore, as described above, in the first example embodiment, the maximum value of the temperature of the entirety of the plurality of series arm resonator units is small. Hereafter, details of this will be described.

Regarding an acoustic wave resonator, as electrostatic capacitance decreases, exothermic temperature when electric power is input increases. The total electrostatic capacitance of the first series arm resonator unit in the transmission filter 1A according to the first example embodiment is smaller than the total electrostatic capacitance of each of the other series arm resonator units in the transmission filter 1A. Therefore, the exothermic temperature in the series arm resonator unit S4, which is the first series arm resonator unit, is higher than the exothermic temperature in the other series arm resonator units.

Here, an acoustic wave resonator generates heat easily when electric power having a frequency between the resonant frequency and the anti-resonant frequency is input. On the other hand, the frequency of the pass band of the transmission filter 1A and the frequency between the resonant frequency and the anti-resonant frequency of each series arm resonator in the reception filter 1B are not likely to overlap. Further, even when electric power having a frequency in the pass band of the transmission filter 1A is input, a signal having a frequency in the pass band of the reception filter 1B flows only slightly. Therefore, even when electric power having a frequency in the pass band of the transmission filter 1A is input, heat is not generated easily in each series arm resonator of the reception filter 1B. In addition, the total electrostatic capacitance of the second series arm resonator unit is larger than the total electrostatic capacitance of each of the other series arm resonator units of the reception filter 1B. Thus, the second series arm resonator unit is even more unlikely to generate heat easily.

In the multiplexer 10, the distance between the first series arm resonator unit, which is most likely to generate heat easily, and the second series arm resonator unit, which is most unlikely to generate heat easily, is the shortest among the distances between all series arm resonator units of the transmission filter 1A and all resonator units of the reception filter 1B. Thus, it is possible to effectively increase the heat dissipation capability of the first series arm resonator unit. Then, as the entirety of the multiplexer 10, it is possible to increase the heat dissipation capability of the series arm resonator.

As the exothermic temperature of an acoustic wave resonator increases, it becomes more likely that deterioration of an IDT electrode due to stress migration occurs when electric power is applied. Therefore, electric power handling capability decreases. In contrast, with the first example embodiment, it is possible to improve the heat dissipation capability of the series arm resonator, and it is possible reduce or prevent an increase in the temperature of the series arm resonator. Accordingly, as the entirety of the multiplexer 10, electric power handling capability does not deteriorate easily.

Further, product life was compared between the multiplexer according to the first example embodiment and the multiplexer according to the first comparative example. To be specific, electric power of about 31 dBm was continuously input to the first signal terminal of each multiplexer, and the time when multiplexer malfunctioned was compared. As a result, the product life was about 2800 hours in the first example embodiment and about 1200 hours in the first comparative example. In this way, it was confirmed that, with the first example embodiment, the product life was increased by about 2.3 times compared with the first comparative example. This is because, with the first example embodiment, it is possible to increase the heat dissipation capability of the series arm resonator, and the electric power handling capability does not deteriorate easily as the entirety of the multiplexer.

As described above, in the first example embodiment, all resonators are surface acoustic wave resonators. Hereafter, specific configurations of each resonator will be described.

Figure 10:
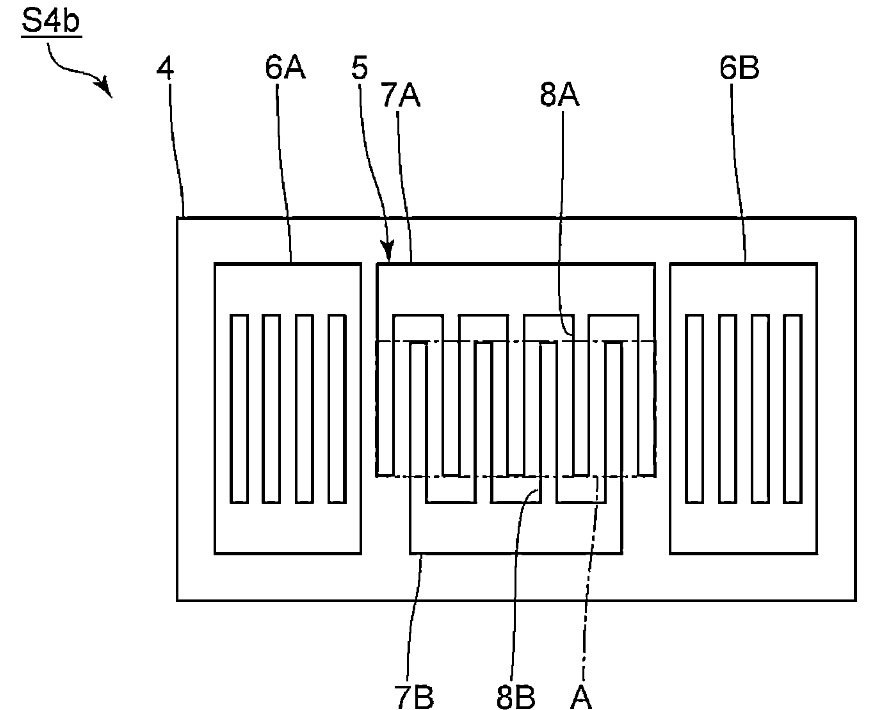
FIG. 10 is a plan view illustrating an electrode configuration of a first series arm resonator in an example embodiment of the present invention.

FIG. 10 is a plan view illustrating the electrode configuration of the first series arm resonator in the first example embodiment. In FIG. 10, wiring and the like connected to the series arm resonator S4*b* as the first series arm resonator are omitted.

The series arm resonator S4*b* shares the piezoelectric substrate 4 with each of the other series arm resonators and each of the other parallel arm resonators. The piezoelectric substrate 4 is a substrate having piezoelectricity. In the first example embodiment, the piezoelectric substrate 4 is a substrate made of only a piezoelectric material. For example, lithium niobate is used as the piezoelectric material. To be more specific, for example, Y-cut $LiNbO_3$ is used as the piezoelectric material. However, the piezoelectric material is not limited to the above, and it is also possible to use, for example, lithium tantalate, zinc oxide, aluminum nitride, quartz, PZT (lead zirconate titanate), or the like.

The piezoelectric substrate 4 may be a multilayer substrate including a piezoelectric layer. It is possible to use the piezoelectric materials for the piezoelectric layer. When the piezoelectric substrate 4 is a multilayer substrate, for example, a piezoelectric layer may be stacked on a support substrate. Alternatively, for example, at least one dielectric layer may be stacked between a support substrate and a piezoelectric layer.

As illustrated in FIG. 10, the series arm resonator S4*b* includes an IDT electrode 5 and a pair of reflectors 6A and 6B. The IDT electrode 5 is provided on the piezoelectric substrate 4. The IDT electrode 5 includes a plurality of electrode fingers. When an alternating voltage is applied to the IDT electrode 5, an acoustic wave is excited. In the first example embodiment, for example, a Love wave is excited as the main mode. Here, when the direction in which the plurality of electrode fingers extend is defined as "electrode-finger-extending direction", the pair of reflectors 6A and 6B are provided on the piezoelectric substrate 4 on both sides in a direction perpendicular or substantially perpendicular to the electrode-finger-extending direction.

To be more specific, the IDT electrode 5 includes a first busbar 7A and a second busbar 7B, and a plurality of first electrode fingers 8A and a plurality of second electrode fingers 8B, as a plurality of electrode fingers. The first busbar 7A and the second busbar 7B face each other. One end of each of the plurality of first electrode fingers 8A is connected to the first busbar 7A. One end of each of the plurality of second electrode fingers 8B is connected to the second busbar 7B. The first electrode fingers 8A and the second electrode fingers 8B are connected to potentials that differ from each other. The plurality of first electrode fingers 8A and the plurality of second electrode fingers 8B are interdigitated with each other. The IDT electrode 5, the reflector 6A, and the reflector 6B each may include single-layer metal film, or may include a multilayer metal film.

Hereafter, the first electrode fingers 8A and the second electrode fingers 8B may be collectively and simply referred to as electrode fingers. The crossing region A of the IDT electrode 5 is a region in which adjacent electrode fingers, which are connected to potentials that differ from each other, overlap each other when seen from the direction perpendicular to the electrode-finger-extending direction. An acoustic wave is excited in the crossing region A. A set of one electrode finger and one electrode finger that are connected to potentials that differ from each other and that are adjacent to each other will be referred to as "a pair of electrode fingers". When the total number of electrode fingers in the crossing region A is N, the number of pairs is N/2 [pairs]. When N is an odd number, the total number of pairs has a value represented as an integer+0.5 [pairs].

As with the series arm resonator S4*b*, each series arm resonator and each parallel arm resonator other than the series arm resonator S4*b* illustrated in FIG. 1 also include an IDT electrode and a pair of reflectors and a crossing region. In the first example embodiment, each of the series arm resonators and each of the parallel arm resonators are surface acoustic wave resonators that are configured to be capable of using a Love wave, for example. However, a main mode used in each series arm resonator and each parallel arm resonator in the multiplexer 10 is not limited to a Love wave.

As described above, regarding an acoustic wave resonator, as electrostatic capacitance decreases, exothermic temperature when electric power is input increases. On the other hand, as electrostatic capacitance increases, exothermic temperature when electric power is input decreases. This is because, as electrostatic capacitance increases, the area of the IDT electrode increases, and power consumption per unit area of the IDT electrode decreases. In addition, as electrostatic capacitance increases, impedance decreases, and thus power consumption itself tends to decrease. As a result of these, heat generation due to application of electric power is reduced or prevented.

The electrostatic capacitance is proportional mainly to the product of the number of pairs of the plurality of electrode fingers and the crossing width of the IDT electrode. The crossing width is the dimension of the crossing region in the electrode-finger-extending direction. As the electrostatic capacitance increases, the product of the number of pairs of a plurality of electrode fingers and the crossing width increases, and the area of the IDT electrode increases. Thus, in the first example embodiment, the product of the number of pairs of the plurality of electrode fingers and the crossing width in the first series arm resonator of the first series arm resonator unit is the smallest among the products of the numbers of pairs of the plurality of electrode fingers and the crossing widths in all series arm resonators of the transmission filter 1A. On the other hand, the product of the number of pairs of the plurality of electrode fingers and the crossing width in the second series arm resonator of the second series arm resonator unit is the largest among the products of the numbers of pairs of the plurality of electrode fingers and the crossing widths in all series arm resonators of the reception filter 1B.

When the area of the IDT electrode is increased, the electrostatic capacitance increases, and the exothermic temperature decreases. However, increase in the areas of all IDT electrodes would lead to increase in the size of the multiplexer. On the other hand, with existing technologies, in order to increase heat dissipation capability, the number of bumps for joining a piezoelectric substrate to a package substrate or the like has been increased. However, this would also lead to increase in the size of the entire device, including the package substrate and the bumps.

In contrast, as illustrated in FIG. 2, in the first example embodiment, the series arm resonator unit S4, whose total electrostatic capacitance is the smallest in the transmission filter 1A, and the series arm resonator unit S11, whose total electrostatic capacitance is the largest in the reception filter 1B, are adjacent to each other. To be more specific, the distance between the series arm resonator S4*b* of the series arm resonator unit S4 and the series arm resonator S11*a* of the series arm resonator unit S11 is the shortest among the distances between the plurality of series arm resonators of the transmission filter 1A and the plurality of resonators of the reception filter 1B. Thus, even when the area of the IDT electrode in each series arm resonator of the series arm resonator unit S4 is small, it is possible to effectively increase heat dissipation capability as described above. Accordingly, it is possible to reduce or prevent deterioration of electric power handling capability without increasing the size of the multiplexer 10.

As shown in Table 6, in the first example embodiment, the temperature of the series arm resonator unit S11, which is the second series arm resonator unit, is comparatively high. This is because heat from the series arm resonator unit S4, which is the first series arm resonator unit, is transmitted to the series arm resonator unit S11.

As illustrated in FIG. 2, the series arm resonator unit S2 of the transmission filter 1A is surrounded by other resonators. Therefore, among the plurality of series arm resonator units of the transmission filter 1A, the heat dissipation capability of the series arm resonator unit S2 is particularly low. The same applies to the first comparative example illustrated in FIG. 5. Further, in the first comparative example, the total electrostatic capacitance of the series arm resonator unit S2 is comparatively small. Therefore, among the plurality of series arm resonator units, the temperature in the series arm resonator unit S2 is the highest.

In contrast, in the first example embodiment, as shown in Table 1, the total electrostatic capacitance of the series arm resonator unit S2 is comparatively large. Therefore, the exothermic temperature in the series arm resonator unit S2 is low. Thus, it is possible to reduce the temperature of the series arm resonator unit S2. Accordingly, as the entirety of the multiplexer 10, it is possible to effectively reduce or prevent deterioration of electric power handling capability.

In the first comparative example, as illustrated in FIG. 5, the number of series arm resonators in the series arm resonator unit S4 is, for example, three, and the area of each series arm resonator is large. On the other hand, the number of series arm resonators in the series arm resonator unit S2 is, for example, two, and the area of each series arm resonator is comparatively small. On the piezoelectric substrate 4, the area occupied by the series arm resonator unit S4 is large, and the area occupied by the series arm resonator unit S2 is small. As a result, the temperature of the series arm resonator unit S2 is high. Heat of the series arm resonator unit S2 is easily transmitted also to the parallel arm resonator unit P3, which is adjacent to and connected through wiring to the series arm resonator unit S2 on the piezoelectric substrate 4. Therefore, as shown in Table 5, the temperature of the parallel arm resonator unit P3 is high.

In contrast, in the first example embodiment, on the piezoelectric substrate 4, since the area occupied by the series arm resonator unit S4 is small, the area occupied by the series arm resonator unit S2 can be increased. To be more specific, for example, the number of series arm resonators in the series arm resonator unit S2 is three, and the area of each series arm resonator is large. Thus, even in the series arm resonator unit S2, whose heat dissipation capability is comparatively low, an increase in temperature is reduced or prevented. Accordingly, it is also possible to reduce or prevent increase in the temperature of the parallel arm resonator unit P3.

Further, in the first example embodiment and the first comparative example, the composite capacitance of all series arm resonator units in the transmission filter is the same or approximately the same. In this way, with the first example embodiment, although the bandpass characteristic of the transmission filter is the same or approximately the same as that of the first comparative example, it is possible to reduce or prevent increase in the temperature of each series arm resonator unit and it is possible to reduce or prevent deterioration of electric power handling capability. Further, increase in the size of the multiplexer is not likely to occur.

In the second comparative example, as illustrated in FIG. 7, among the plurality of series arm resonator units of the reception filter, the series arm resonator unit S11 is located at the shortest distance to the series arm resonator unit S4, which is the first series arm resonator unit. In the second comparative example, as shown in Table 2, the total electrostatic capacitance of the series arm resonator unit S11 is small. Therefore, the exothermic temperature of the series arm resonator unit S11 itself is comparatively high. Thus, the heat dissipation capability of the series arm resonator unit S4 is low. As shown in Tables 4 and 6, in the second comparative example, temperature is high in both of the series arm resonator unit S4 and the series arm resonator unit S11.

In contrast, in the first example embodiment, as described above, among the plurality of series arm resonator units of the reception filter 1B, the series arm resonator unit S11, whose total electrostatic capacitance is the largest, is located at the shortest distance to the series arm resonator unit S4. Thus, it is possible to effectively improve the heat dissipation capability of the series arm resonator unit S4.

In the third comparative example, as illustrated in FIG. 9, the parallel arm resonator in the parallel arm resonator unit P11 is located at a shorter distance to the series arm resonator of the series arm resonator unit S4, which is the first series arm resonator unit, than the series arm resonator of the series arm resonator unit S11, which is the second series arm resonator unit, is. The exothermic temperature in a parallel arm resonator of the reception filter is higher than the exothermic temperature in a series arm resonator of the reception filter. Therefore, in the third comparative example, the heat dissipation capability of the series arm resonator unit S4 is low. As shown in Tables 4 and 7, in the third comparative example, temperature is high in both of the series arm resonator unit S4 and the parallel arm resonator unit P11.

In contrast, in the first example embodiment, among all resonators of the reception filter 1B, the series arm resonator of the series arm resonator unit S11, which is the second series arm resonator unit, is disposed at the shortest distance to the series arm resonator of the series arm resonator unit S4. As described above, even when electric power having a frequency in the pass band of the transmission filter 1A is input, heat is not generated easily in the series arm resonator unit S11. Thus, it is possible to effectively improve the heat dissipation capability of the series arm resonator unit S4.

Each series arm resonator and each parallel arm resonator of the multiplexer 10 may be, for example, BAW (Bulk Acoustic Wave) devices. The electrostatic capacitance of a BAW device is proportional to the opposing area of excitation electrodes.

Hereafter, preferred configurations in the first example embodiment will be described.

As illustrated in FIG. 2, on the piezoelectric substrate 4, it is preferable that, among all resonators of the transmission filter 1A, one of the series arm resonators in the series arm resonator unit S4, which is the first series arm resonator unit, is located at the shortest distance to all resonators of the reception filter 1B. That is, it is preferable that, compared with not only all series arm resonators but also all parallel arm resonators of the transmission filter 1A, the series arm resonator of the first series arm resonator unit is located at the shortest distance to all series arm resonators and parallel arm resonators of the reception filter 1B. In this case, it is possible to more reliably reduce the distance between the series arm resonator in the first series arm resonator unit of the transmission filter 1A and the series arm resonator in the series arm resonator unit of the reception filter 1B. Thus, it is possible to more reliably improve the heat dissipation capability of the series arm resonator of the transmission filter 1A.

As described above, the series arm resonator S4*b* in the series arm resonator unit S4 is a first series arm resonator. The electrostatic capacitance of the first series arm resonator is the smallest among the electrostatic capacities of all series arm resonators in the transmission filter 1A. The series arm resonator S11*a* in the series arm resonator unit S11 is a second series arm resonator. The electrostatic capacitance of the second series arm resonator is the largest among the electrostatic capacities of all series arm resonators in the reception filter 1B. It is preferable that the distance between the first series arm resonator and the second series arm resonator is the shortest among the distances between the plurality of series arm resonators in the first series arm resonator unit and the plurality of series arm resonators in the second series arm resonator unit. Thus, it is possible to further improve the heat dissipation capability of the first series arm resonator, whose exothermic temperature is the highest in the transmission filter 1A. Accordingly, as the entirety of the multiplexer 10, it is possible to further reduce or prevent deterioration of electric power handling capability.

Among all parallel arm resonators of the reception filter 1B, the parallel arm resonator in the parallel arm resonator unit P11 is located, on the piezoelectric substrate 4, at the shortest distance to the series arm resonator in the first series arm resonator unit of the transmission filter 1A. In this case, it is preferable that the parallel arm resonator unit P11 includes a parallel arm resonator having the largest electrostatic capacitance among all parallel arm resonators of the reception filter 1B. Thus, heat is not generated easily in the parallel arm resonator unit P11. Since the distance between the parallel arm resonator in the parallel arm resonator unit P11 and the series arm generator in the series arm resonator unit S4, which is the first series arm resonator unit, is short as described above, it is possible to further increase the heat dissipation capability of the series arm resonator unit S4.

However, in the first example embodiment, the parallel arm resonator unit P11 includes one parallel arm resonator. Therefore, it is preferable that the electrostatic capacitance of the parallel arm resonator is the largest among the electrostatic capacities of all parallel arm resonators of the reception filter 1B.

It is more preferable that the distance between the first series arm resonator and a parallel arm resonator having the largest electrostatic capacitance among all parallel arm resonators of the reception filter 1B is the shortest among the distances between the first series arm resonator and all parallel arm resonators of the reception filter 1B. Thus, it is possible to further effectively increase the heat dissipation capability of the first series arm resonator.

It is preferable that the center frequency of the pass band of the reception filter 1B is higher than the center frequency of the pass band of the transmission filter 1A. In this case, the frequency of the pass band of the transmission filter 1A and the frequency between the resonant frequency and the anti-resonant frequency of each series arm resonator in the reception filter 1B are not likely to overlap. For example, when electric power is applied with the frequency Hch indicated by the arrow M1 in FIGS. 3 and 4, heat generation in each series arm resonator of the reception filter 1B is not likely to occur easily. Thus, heat is dissipated easily from the first series arm resonator unit of the transmission filter 1A toward the second series arm resonator unit of the reception filter 1B. Accordingly, it is possible to more reliably improve the heat dissipation capability of the first series arm resonator unit.

When the pass band of the transmission filter 1A and the pass band of the reception filter 1B are close to each other, the frequency between the resonant frequency and the anti-resonant frequency of the parallel arm resonator of the reception filter 1B is likely to overlap the pass band of the transmission filter 1A. For example, when the difference between an end portion on the higher-frequency side of the pass band of the transmission filter 1A and an end portion on the lower-frequency side of the pass band of the reception filter 1B is less than or equal to about 2% of the center frequency of the pass band in the transmission filter 1A, the overlapping is particularly likely to occur. In this case, heat generation occurs easily in the parallel arm resonator of the reception filter 1B. Thus, the configuration of the first example embodiment in which the distance between the series arm resonator in the first series arm resonator unit of the transmission filter 1A and the series arm resonator in the second series arm resonator unit of the reception filter 1B is short is particularly preferable.

As described above, in the first example embodiment, among all parallel arm resonators of the reception filter 1B, the parallel arm resonator in the parallel arm resonator unit P11 is located, on the piezoelectric substrate 4, at the shortest distance to the series arm resonator in the first series arm resonator unit of the transmission filter 1A. In this case, it is preferable that the parallel arm resonator unit P11 includes a parallel arm resonator having the highest resonant frequency among all parallel arm resonators of the reception filter 1B.

In the first example embodiment, the pass band of the reception filter 1B is positioned on the higher-frequency side than the pass band of the transmission filter 1A. Therefore, as the resonant frequency of the parallel arm resonator in the reception filter 1B increases, it becomes more likely that the resonant frequency separates toward the higher-frequency side from the pass band of the transmission filter 1A. Then, the frequency between the resonant frequency and the anti-resonant frequency of the parallel arm resonator is not likely to overlap the pass band of the transmission filter 1A. Thus, even when electric power having a frequency in the pass band of the transmission filter 1A is applied, the parallel arm resonator does not generate heat easily. Since the distance between the parallel arm resonator in the parallel arm resonator unit P11 and the series arm resonator in the first series arm resonator unit is short as described above, it is possible to further increase the heat dissipation capability of the first series arm resonator unit.

It is more preferable that the distance between the first series arm resonator and a parallel arm resonator having the largest electrostatic capacitance among all parallel arm resonators of the reception filter 1B is the shortest among the distances between the first series arm resonator and all parallel arm resonators of the reception filter 1B. Thus, it is possible to further effectively increase the heat dissipation capability of the first series arm resonator.

It is preferable that the second series arm resonator unit of the reception filter 1B includes a plurality of divided series arm resonators that are connected in series to each other. Thus, it is possible to increase the areas of IDT electrodes in the second series arm resonator unit, and it is possible to increase the total electrostatic capacitance. Thus, it is possible to reduce the exothermic temperature in the second series arm resonator unit. Accordingly, it is possible to effectively increase the heat dissipation capability of the first series arm resonator unit. In addition, it is possible to reduce power consumption per unit area in the second series arm resonator unit, and thus the electric power handling capability of each series arm resonator in the second series arm resonator unit does not deteriorate easily.

In the first example embodiment, for example, the number of series arm resonators in the series arm resonator unit S4, which is the first series arm resonator unit, of the transmission filter 1A is two. The number of series arm resonators of the series arm resonator unit S11, which is the second series arm resonator unit, of the reception filter 1B is three. In this way, it is preferable that the number of series arm resonators in the second series arm resonator unit is larger than the number of series arm resonators in the first series arm resonator unit. Thus, it is possible to more reliably increase the total electrostatic capacitance of the second series arm resonator unit. In addition, it is possible to more reliably reduce the area of the first series arm resonator unit. Accordingly, it is possible to more reliably increase the heat dissipation capability of the first series arm resonator unit without increasing the size of the multiplexer 10, and it is possible to more reliably reduce or prevent deterioration of electric power handling capability as the entirety of the multiplexer 10.

The first series arm resonator unit may include one series arm resonator, and the number of series arm resonators in the second series arm resonator unit may be larger than the number of series arm resonators in the first series arm resonator unit. However, it is preferable that the first series arm resonator unit includes a plurality of divided series arm resonators that are connected in series to each other. Thus, it is also possible to reduce the exothermic temperature in the entirety of the first series arm resonator unit. Accordingly, electric power handling capability is further unlikely to deteriorate easily.

As illustrated in FIG. 1, the transmission filter 1A and the reception filter 1B are connected in common to the common connection terminal 2. It is preferable that, among all resonators of the transmission filter 1A, one of the series arm resonators in the first series arm resonator unit of the transmission filter 1A is closest to the common connection terminal 2. Thus, heat is dissipated easily from the first series arm resonator unit to the outside via the common connection terminal 2. Thus, it is possible to effectively increase the heat dissipation capability of the first series arm resonator unit.

In this case, it is preferable that, among all resonators of the reception filter 1B, one of the series arm resonators of the second series arm resonator unit of the reception filter 1B is closest to the common connection terminal 2. Thus, it is easy to reduce the distance between the second series arm resonator unit and the first series arm resonator unit, and it is possible to more reliably improve the heat dissipation capability of the first series arm resonator unit.

It is more preferable that, among all resonators of the transmission filter 1A, the series arm resonator S4*b*, which is the first series arm resonator, is closest to the common connection terminal 2. It is more preferable that, among all resonators of the reception filter 1B, the series arm resonator S11*a*, which is the second series arm resonator, is closest to the common connection terminal 2. Thus, it is possible to further increase the heat dissipation capability of the first series arm resonator.

As illustrated in FIG. 2, the multiplexer 10 includes a wiring electrode 9. The wiring electrode 9 is connected to the common connection terminal 2. By the wiring electrode 9, a series arm resonator that is closest to the common connection terminal 2 side in the transmission filter 1A and a series arm resonator that is closest to the common connection terminal 2 side in the reception filter 1B are connected. It is preferable that the series arm resonator of the transmission filter 1A and the series arm resonator of the reception filter 1B that are connected by the wiring electrode 9 are a series arm resonator in the first series arm resonator unit and a series arm resonator in the second series arm resonator unit. It is more preferable that the first series arm resonator and the second series arm resonator are connected by the wiring electrode 9. Since the wiring electrode 9 is made of a metal, the thermal conductivity of the wiring electrode 9 is higher than the thermal conductivity of the piezoelectric substrate 4. Thus, heat is dissipated easily from the first series arm resonator unit toward the second series arm resonator unit. Accordingly, it is possible to further effectively increase the heat dissipation capability of the first series arm resonator unit.

It is preferable that, for example, Al is used as the material of the wiring electrode 9. Thus, it is possible to more reliably increase the thermal conductivity of the wiring electrode 9.

It is preferable that the transmission filter 1A and the reception filter 1B are, for example, ladder filters. In this case, compared with a case where the transmission filter 1A or the reception filter 1B includes a longitudinally coupled resonator acoustic wave filter, electric power handling capability does not deteriorate easily as the entirety of the multiplexer 10.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:

a transmission filter and a reception filter each including a plurality of resonators including one or more series arm resonators; wherein the transmission filter includes a piezoelectric substrate and a first series arm resonator unit on the piezoelectric substrate;

the reception filter shares the piezoelectric substrate with the transmission filter and includes a second series arm resonator unit on the piezoelectric substrate;

the transmission filter includes an input terminal, an output terminal, and a ground terminal, and, in a circuit configuration of the transmission filter, a path connecting the input terminal and the output terminal is a series arm, a path branching from the series arm to the ground terminal is a parallel arm, and a connection point between the series arm and the parallel arm is a node;

the first series arm resonator unit includes one of the series arm resonators in the transmission filter or a group of a plurality of the series arm resonators in the transmission filter that are connected in series to each other without the node therebetween;

the reception filter includes an input terminal, an output terminal, and a ground terminal, and, in a circuit configuration of the reception filter, a path connecting the input terminal and the output terminal is a series arm, a path branching from the series arm to the ground terminal is a parallel arm, and a connection point between the series arm and the parallel arm is a node;

the second series arm resonator unit includes one of the series arm resonators in the reception filter or a group of a plurality of the series arm resonators in the reception filter that are connected in series to each other without the node therebetween;

on the piezoelectric substrate, among all of the series arm resonators of the transmission filter, one of the series arm resonators in the first series arm resonator unit is located at a shortest distance to all of the resonators of the reception filter;

on the piezoelectric substrate, among all of the resonators of the reception filter, one of the series arm resonators in the second series arm resonator unit is located at a shortest distance to one of the series arm resonators of the first series arm resonator unit of the transmission filter;

the first series arm resonator unit includes a first series arm resonator with a smallest electrostatic capacitance among all of the series arm resonators of the transmission filter; and the second series arm resonator unit includes a second series arm resonator with a largest electrostatic capacitance among all of the series arm resonators of the reception filter.

2. The multiplexer according to claim 1, wherein the transmission filter and the reception filter share a common connection terminal; and the common connection terminal is the output terminal of the transmission filter and is the input terminal of the reception filter.

3. The multiplexer according to claim 1, wherein the plurality of resonators of the transmission filter include one or more parallel arm resonators; and on the piezoelectric substrate, among all of the resonators of the transmission filter, one of the series arm resonators in the first series arm resonator unit is located at a shortest distance to all of the resonators of the reception filter.

4. The multiplexer according to claim 1, wherein the plurality of resonators of the reception filter include one or more parallel arm resonators;

the reception filter includes a parallel arm resonator unit on the piezoelectric substrate;

the parallel arm resonator unit includes one of the parallel arm resonators or a group of a plurality of the parallel arm resonators that are connected in series to each other in the parallel arm; and on the piezoelectric substrate, the parallel arm resonator unit including, among all of the parallel arm resonators of the reception filter, the parallel arm resonator that is located at a shortest distance to one of the series arm resonators in the first series arm resonator unit of the transmission filter includes the parallel arm resonator with a largest electrostatic capacitance among all of the parallel arm resonators of the reception filter.

5. The multiplexer according to claim 1, wherein a center frequency of a pass band of the reception filter is higher than a center frequency of a pass band of the transmission filter.

6. The multiplexer according to claim 5, wherein the plurality of resonators of the reception filter include one or more parallel arm resonators;

the reception filter includes a parallel arm resonator unit on the piezoelectric substrate;

the parallel arm resonator unit includes one of the parallel arm resonators or a group of a plurality of the parallel arm resonators that are connected in series to each other in the parallel arm; and on the piezoelectric substrate, the parallel arm resonator unit including, among all of the parallel arm resonators of the reception filter, the parallel arm resonator that is located at a shortest distance to one of the series arm resonators in the first series arm resonator unit of the transmission filter includes the parallel arm resonator with a highest resonant frequency among all of the parallel arm resonators of the reception filter.

7. The multiplexer according to claim 1, wherein the second series arm resonator unit of the reception filter includes a plurality of the series arm resonators each of which is a divided series arm resonator and that are connected in series to each other.

8. The multiplexer according to claim 7, wherein a number of the series arm resonators in the second series arm resonator unit of the reception filter is larger than a number of the series arm resonators in the first series arm resonator unit of the transmission filter.

9. The multiplexer according to claim 7, wherein
the first series arm resonator unit of the transmission filter includes a plurality of the series arm resonators each of which is a divided series arm resonator and that are connected in series to each other; and
a distance between the first series arm resonator in the first series arm resonator unit of the transmission filter and the second series arm resonator in the second series arm resonator unit of the reception filter is shortest among distances between a plurality of the series arm resonators in the first series arm resonator unit and a plurality of the series arm resonators in the second series arm resonator unit.

10. The multiplexer according to claim 1, wherein the first series arm resonator unit of the transmission filter includes a plurality of the series arm resonators each of which is a divided series arm resonator and that are connected in series to each other.

11. The multiplexer according to claim 1, further comprising:
a common connection terminal to which the transmission filter and the reception filter are connected in common; and
a wiring electrode connected to the common connection terminal; wherein
among all of the resonators of the transmission filter, one of the series arm resonators in the first series arm resonator unit of the transmission filter is closest to the common connection terminal;
among all of the resonators of the reception filter, one of the series arm resonators in the second series arm resonator unit of the reception filter is closest to the common connection terminal; and
the series arm resonator closest to the common connection terminal in the transmission filter and the series arm resonator closest to the common connection terminal in the reception filter are connected by the wiring electrode.

12. The multiplexer according to claim 11, wherein
among all of the resonators of the transmission filter, the first series arm resonator in the first series arm resonator unit of the transmission filter is closest to the common connection terminal;
among all of the resonators of the reception filter, the second series arm resonator in the second series arm resonator unit of the reception filter is closest to the common connection terminal; and
the first series arm resonator and the second series arm resonator are connected by the wiring electrode.

13. The multiplexer according to claim 1, wherein
the transmission filter is a ladder filter including the series arm resonators and a parallel arm resonator; and
the reception filter is a ladder filter including the series arm resonators and a parallel arm resonator.

14. A multiplexer comprising:
a transmission filter and a reception filter each including a plurality of resonators including one or more series arm resonators; wherein
the transmission filter includes a piezoelectric substrate and a first series arm resonator unit on the piezoelectric substrate;
the reception filter shares the piezoelectric substrate with the transmission filter and includes a second series arm resonator unit on the piezoelectric substrate;
the transmission filter includes an input terminal, an output terminal, and a ground terminal, and, in a circuit configuration of the transmission filter, a path connecting the input terminal and the output terminal is a series arm, a path branching from the series arm to the ground terminal is a parallel arm, and a connection point between the series arm and the parallel arm is a node;
the first series arm resonator unit includes one of the series arm resonators in the transmission filter or a group of a plurality of the series arm resonators in the transmission filter that are connected in series to each other without the node therebetween;
the reception filter includes an input terminal, an output terminal, and a ground terminal, and, in a circuit configuration of the reception filter, a path connecting the input terminal and the output terminal is a series arm, a path branching from the series arm to the ground terminal is a parallel arm, and a connection point between the series arm and the parallel arm is a node;
the second series arm resonator unit includes one of the series arm resonators in the reception filter or a group of a plurality of the series arm resonators in the reception filter that are connected in series to each other without the node therebetween;
on the piezoelectric substrate, among all of the series arm resonators of the transmission filter, one of the series arm resonators in the first series arm resonator unit is located at a shortest distance to all of the resonators of the reception filter;
on the piezoelectric substrate, among all of the resonators of the reception filter, one of the series arm resonators in the second series arm resonator unit is located at a shortest distance to one of the series arm resonators of the first series arm resonator unit of the transmission filter;
the series arm resonators of each of the transmission filter and the reception filter each include an IDT electrode, and each of the IDT electrodes includes a plurality of electrode fingers and a crossing region in which, when a direction in which the plurality of electrode fingers extend is defined as an electrode-finger-extending direction, the electrode fingers that are adjacent to each other overlap each other in a direction perpendicular or substantially perpendicular to the electrode-finger-extending direction; and
when a dimension of the crossing region in the electrode-finger-extending direction is defined as a crossing width, the first series arm resonator unit includes a first series arm resonator for which a product of a number of pairs of the plurality of electrode fingers and a crossing width is smallest among all of the series arm resonators of the transmission filter, and the second series arm resonator unit includes a second series arm resonator for which the product of a number of pairs of the plurality of electrode fingers and the crossing width is largest among all of the series arm resonators of the reception filter.

15. The multiplexer according to claim 14, wherein
the transmission filter and the reception filter share a common connection terminal; and
the common connection terminal is the output terminal of the transmission filter and is the input terminal of the reception filter.

16. The multiplexer according to claim 14, wherein
the plurality of resonators of the transmission filter include one or more parallel arm resonators; and
on the piezoelectric substrate, among all of the resonators of the transmission filter, one of the series arm resonators in the first series arm resonator unit is located at a shortest distance to all of the resonators of the reception filter.

17. The multiplexer according to claim 14, wherein the plurality of resonators of the reception filter include one or more parallel arm resonators;

the reception filter includes a parallel arm resonator unit on the piezoelectric substrate;

the parallel arm resonator unit includes one of the parallel arm resonators or a group of a plurality of the parallel arm resonators that are connected in series to each other in the parallel arm; and on the piezoelectric substrate, the parallel arm resonator unit including, among all of the parallel arm resonators of the reception filter, the parallel arm resonator that is located at a shortest distance to one of the series arm resonators in the first series arm resonator unit of the transmission filter includes the parallel arm resonator with a largest electrostatic capacitance among all of the parallel arm resonators of the reception filter.

18. The multiplexer according to claim 14, wherein a center frequency of a pass band of the reception filter is higher than a center frequency of a pass band of the transmission filter.

19. The multiplexer according to claim 18, wherein the plurality of resonators of the reception filter include one or more parallel arm resonators;

the reception filter includes a parallel arm resonator unit on the piezoelectric substrate;

the parallel arm resonator unit includes one of the parallel arm resonators or a group of a plurality of the parallel arm resonators that are connected in series to each other in the parallel arm; and on the piezoelectric substrate, the parallel arm resonator unit including, among all of the parallel arm resonators of the reception filter, the parallel arm resonator that is located at a shortest distance to one of the series arm resonators in the first series arm resonator unit of the transmission filter includes the parallel arm resonator with a highest resonant frequency among all of the parallel arm resonators of the reception filter.

20. The multiplexer according to claim 14, wherein the second series arm resonator unit of the reception filter includes a plurality of the series arm resonators each of which is a divided series arm resonator and that are connected in series to each other.

* * * * *